(12) United States Patent
Cuchiaro et al.

(10) Patent No.: US 6,512,256 B1
(45) Date of Patent: Jan. 28, 2003

(54) INTEGRATED CIRCUIT HAVING SELF-ALIGNED HYDROGEN BARRIER LAYER AND METHOD FOR FABRICATING SAME

(75) Inventors: Joseph D. Cuchiaro, Colorado Springs, CO (US); Akira Furuya, Tokyo (JP); Carlos A. Paz de Araujo, Colorado Springs, CO (US); Yoichi Miyasaka, Tokyo (JP)

(73) Assignees: Symetrix Corporation, Colorado Springs, CO (US); NEC Corporation, Tokyo (JP)

( * ) Notice: Subject to any disclaimer, the term of this patent is extended or adjusted under 35 U.S.C. 154(b) by 0 days.

(21) Appl. No.: 09/197,385

(22) Filed: Nov. 20, 1998

(51) Int. Cl.$^7$ .................... H01L 31/119; H01L 27/108; H01L 29/76; H01L 29/94
(52) U.S. Cl. .................................. 257/295
(58) Field of Search ................ 257/295–296, 257/300–310; 438/396–399, 243–253, 3

(56) References Cited

U.S. PATENT DOCUMENTS

| | | | |
|---|---|---|---|
| 5,046,043 A | | 9/1991 | Miller et al. |
| 5,434,102 A | | 7/1995 | Watanabe et al. |
| 5,456,945 A | | 10/1995 | McMillan et al. |
| 5,466,629 A | | 11/1995 | Mihara et al. |
| 5,468,679 A | * | 11/1995 | Paz de Araujo et al. ........ 438/3 |
| 5,468,684 A | | 11/1995 | Yoshimori et al. |
| 5,481,490 A | | 1/1996 | Watanabe et al. |
| 5,519,234 A | | 5/1996 | Paz de Araujo et al. |
| 5,523,595 A | | 6/1996 | Takenaka et al. |
| 5,523,964 A | | 6/1996 | McMillan et al. |
| 5,638,319 A | * | 6/1997 | Onishi et al. ................ 257/295 |
| 5,716,875 A | * | 2/1998 | Jones, Jr. et al. ................ 438/3 |
| 6,278,150 B1 | | 8/2001 | Okudaira et al. |

FOREIGN PATENT DOCUMENTS

JP         10-79481         3/1998

* cited by examiner

Primary Examiner—Chong Quang Nguyen
(74) Attorney, Agent, or Firm—Patton Boggs LLP

(57) ABSTRACT

In an integrated circuit, a stack of thin film layers comprising respectively a bottom electrode, a thin film of metal oxide, a top electrode, a lower barrier-adhesion layer, a hydrogen barrier layer, and an upper barrier-adhesion layer are patterned to form a memory capacitor capped with a self-aligned hydrogen barrier layer. Preferably, the top and bottom electrodes comprise platinum, the metal oxide material comprises ferroelectric layered superlattice material, the upper and lower barrier-adhesion layers comprise titanium, and the hydrogen barrier layer comprises titanium nitride. The hydrogen barrier layer inhibits diffusion of hydrogen, thereby preventing hydrogen degradation of the metal oxides. Part of the upper barrier-adhesion layer is removed in order to increase the electrical conductivity in the layer. Preferably, the memory capacitor is a ferroelectric nonvolatile memory. Preferably, the layered superlattice material includes strontium bismuth tantalate or strontium bismuth tantalum niobate.

10 Claims, 4 Drawing Sheets

INTEGRATED CIRCUIT HAVING SELF-ALIGNED HYDROGEN BARRIER LAYER AND METHOD FOR FABRICATING SAME

BACKGROUND OF THE INVENTION

1. Field of the Invention

The invention relates to an integrated circuit having a hydrogen barrier layer to protect circuit elements containing ferroelectric or high-dielectric constant metal oxide materials, and to a method for fabricating such a circuit.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$ type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See Watanabe, U.S. Pat. No. 5,434,102. Layered superlattice materials exhibit characteristics in ferroelectric memories that are orders of magnitude superior to those of PZT and PLZT compounds. Integrated circuit devices containing ferroelectric elements are currently being manufactured. Nevertheless, the persistent problem of hydrogen degradation during the manufacturing process hinders the economical production in commercial quantities of ferroelectric memories and other IC devices using the layered superlattice material compounds with the desired electronic characteristics.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first, bottom electrode and a second, top electrode, the electrodes typically containing platinum. During manufacture of the circuit, the MOSFET is subjected to conditions causing defects in the silicon substrate. For example, the CMOS/MOSFET manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as a forming-gas anneal ("FGA"). Conventionally, FGA treatments are conducted underambient conditions in a $H_2$—$N_2$ gas mixture between 350° and 550° C., typically around 400–450° C., for a time period of about 30 minutes. In addition, the integrated-circuit manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses principally through the top electrode to the ferroelectric thin film and reduces the oxides contained in the ferroelectric material. The absorbed hydrogen also metallizes the surface of the ferroelectric thin film by reducing metal oxides. As a result of these effects, the electronic properties of the capacitor are degraded. Also, the adhesivity of the ferroelectric thin film to the upper electrode is lowered by the chemical change taking place at the interface. Alternatively, the upper electrode is pushed up by the oxygen gas, water, and other products of the oxidation-reduction reactions taking place. Thus, peeling is likely to take place at the interface between the top electrode and the ferroelectric thin film. In addition, hydrogen also can reach the lower electrode, leading to internal stresses that cause the capacitor to peel off its substrate. These problems are acute in ferroelectric memories containing layered superlattice material compounds because these oxide compounds are particularly complex and prone to degradation by hydrogen-reduction. After the forming-gas anneal (FGA), the remnant polarization of the ferroelectrics is very low and no longer suitable for storing information. Also, an increase in leakage currents results.

Several methods have been reported in the art to inhibit or reverse hydrogen degradation desired electronic properties in ferroelectric oxide materials. Oxygen-annealing at high temperature (800° C.) for about one hour results in virtually complete recovery of the ferroelectric properties degraded by hydrogen treatments. But the high-temperature oxygen-anneal itself might generate defects in silicon crystalline structure, thereby offsetting somewhat the positive effects of any prior forming-gas anneal on the CMOS characteristics. Also, a high-temperature oxygen-anneal may only be conducted prior to aluminum metallization. Furthermore, if hydrogen damage has already caused structural damage, such as peeling of the capacitor layers from underlying and overlying layers, then such damage cannot be reversed by an oxygen-recovery anneal.

To reduce the detrimental effects of hydrogen and protect the metal oxide element, the prior art also teaches the application of hydrogen barrier layers to inhibit the diffusion of hydrogen into the ferroelectric or dielectric metal oxide material. The barrier layer is typically applied over the metal oxide element, but it is also sometimes applied below and to the sides of the element. The utilization of hydrogen barrier layers results in added complexity of the manufacturing process, with a corresponding increase in cost. Extra deposition steps are necessary to form the barrier layers on the integrated circuit substrate. The hydrogen barrier layers also require extra patterning steps. If the material used to form the layer is a poor electrical conductor, then it may be necessary to remove it in still other processing steps to avoid interference with electrical signals. Conversely, if the material is conducting, it may lead to shorting of electrical wiring and circuit paths. Furthermore, some well-known compositions of hydrogen barrier layers do not adhere well to metals commonly used in integrated circuits, such as platinum and aluminum.

Hydrogen degradation is also a problem in complex metal oxides used in nonferroelectric, high-dielectric constant applications in integrated circuits. Hydrogen reactions cause structural damage, as described above for ferroelectric oxides, and cause degradation of dielectric properties. Examples of metal oxides subject to hydrogen degradation include barium strontium titanate ("BST"), barium strontium niobate ("BSN"), certain $ABO_3$-type perovskites, and certain layered superlattice materials. Hydrogen barrier layers are, therefore, used also to protect nonferroelectric, high-dielectric constant metal oxides.

Thus, it would be useful to have an integrated circuit having a hydrogen barrier layer and a method for making such a circuit that provide the benefits of a hydrogen barrier layer in protecting ferroelectric and nonferroelectric high-dielectric constant metal oxide materials; in particular, ferroelectric layered superlattice materials from hydrogen degradation, while minimizing the complexity of the integrated circuit and its fabrication method.

3. Solution to the Problem

The invention solves the above problems by providing an integrated circuit having a self-aligning hydrogen barrier layer, and a method for fabricating such an integrated circuit. A hydrogen barrier layer according to the invention protects metal oxide materials by inhibiting the diffusion of hydrogen toward the metal oxides, and thereby preserves the favorable ferroelectric or high-dielectric constant properties of the metal oxide material.

One feature of the invention is formation of an adhesion layer directly over a thin film of metal oxide material. This adhesion layer serves to ensure good adhesion of the hydrogen barrier layer to the underlying circuit layer. This adhesion layer is referred to as the lower, first barrier-adhesion layer. Then a hydrogen barrier layer is formed on the first barrier-adhesion layer, followed by formation of an upper, second barrier-adhesion layer on the hydrogen barrier layer.

The metal oxide material may be ferroelectric material, or it may be nonferroelectric, high-dielectric constant material. The composition of a thin film of ferroelectric material may be selected from a group of suitable ferroelectric oxide materials, including but not limited to: an $ABO_3$-type perovskite, such as a titanate (e.g., $BaTiO_3$, $SrTiO_3$, $PbTiO_3$ (PT), $PbZrTiO_3$ (PZT)), a niobate (e.g., $KNbO_3$), and, preferably, a layered superlattice material. Alternatively, a thin film of nonferroelectric, high-dielectric constant materials may be selected from a group including but not limited to: barium strontium titanate ("BST"), barium strontium niobate ("BSN"), certain $ABO_3$-type perovskites, and certain layered superlattice materials.

Preferably, the metal oxide material comprises ferroelectric layered superlattice material. Preferably, the first barrier-adhesion layer comprises titanium, the hydrogen barrier layer comprises titanium nitride, and the upper, second barrier-adhesion layer comprises titanium and titanium oxide.

An object of the invention is formation of a hydrogen barrier layer directly over a memory capacitor containing a thin film of metal oxide material. A memory capacitor is formed by depositing a bottom electrode layer, then forming the thin film of metal oxide material on the bottom electrode, and finally forming a top electrode layer on the metal oxide thin film. Then a lower, first barrier-adhesion layer is formed on the top electrode directly over the thin film of metal oxide material, followed by formation of the hydrogen barrier layer on the first barrier-adhesion layer directly over the thin film of metal oxide material, and finally formation of the upper, second barrier-adhesion layer on the hydrogen barrier layer. Preferably, the memory capacitor is a ferroelectric, nonvolatile memory capacitor. Preferably, the metal oxide material comprises ferroelectric layered superlattice material. Preferably, the capacitor electrodes comprise platinum.

In a preferred method of the invention, the bottom electrode, the metal oxide thin film, the top electrode, the first barrier-adhesion layer, the hydrogen barrier layer, and the second barrier-adhesion layer form a stack of thin film layers that can be patterned using a minimum number of patterning steps to form self-aligning layers in the integrated circuit.

A feature of the invention is that titanium oxide near the top surface of the second barrier-adhesion layer reacts with hydrogen and inhibits the diffusion of hydrogen towards the metal oxide thin film. The amount of titanium oxide in the top half of the second barrier-adhesion layer is between zero and about 50 percent. The titanium oxide is formed by including between zero and about ten volume percent oxygen-gas in the sputter-atmosphere during the sputter-deposition process of the top half of the upper, second barrier-adhesion layer.

Another object of the invention is to remove a portion of the second barrier-adhesion layer to form a wiring groove at the top of the layer in order to increase the overall electrical conductivity through the layer to the circuit layers below.

In preferred embodiments of the invention, the thin film of ferroelectric layered superlattice material contains strontium bismuth tantalum niobate or strontium bismuth tantalate.

The invention provides an integrated circuit device including a thin film of metal oxide material, a first barrier-adhesion layer above and directly over the metal oxide thin film, a hydrogen barrier layer on the first barrier-adhesion layer and directly over the thin film of metal oxide material, and a second barrier-adhesion layer, having a top surface, on the hydrogen barrier layer. Preferably, the metal oxide material comprises ferroelectric layered superlattice material. Preferably, the first and second barrier-adhesion layers comprise titanium. Preferably, the hydrogen barrier layer comprises titanium nitride. Preferably, the thin film of ferroelectric layered superlattice material, the first barrier-adhesion layer, the hydrogen barrier layer, and the second barrier-adhesion layer are self-aligned. Preferably, a portion of the second barrier-adhesion layer at its top surface has been removed to increase electrical conductivity through the layer. Preferably, the ferroelectric layered superlattice material comprises strontium bismuth tantalate or strontium bismuth tantalum niobate.

In a preferred embodiment, the integrated circuit includes a stack capacitor formed on a semiconductor substrate, including a bottom electrode, the thin film of metal oxide material on the bottom electrode, a top electrode on the metal oxide thin film, with the first barrier-adhesion layer on the top electrode. Preferably, the metal oxide thin film, the top electrode, the first barrier-adhesion layer, the hydrogen barrier layer, and the second barrier-adhesion layer are self-aligned.

Numerous other features, objects and advantages of the invention will become apparent from the following description when read in conjunction with the accompanying drawings.

DETAILED DESCRIPTION OF THE PREFERRED EMBODIMENT

1. Overview

Figure 4:
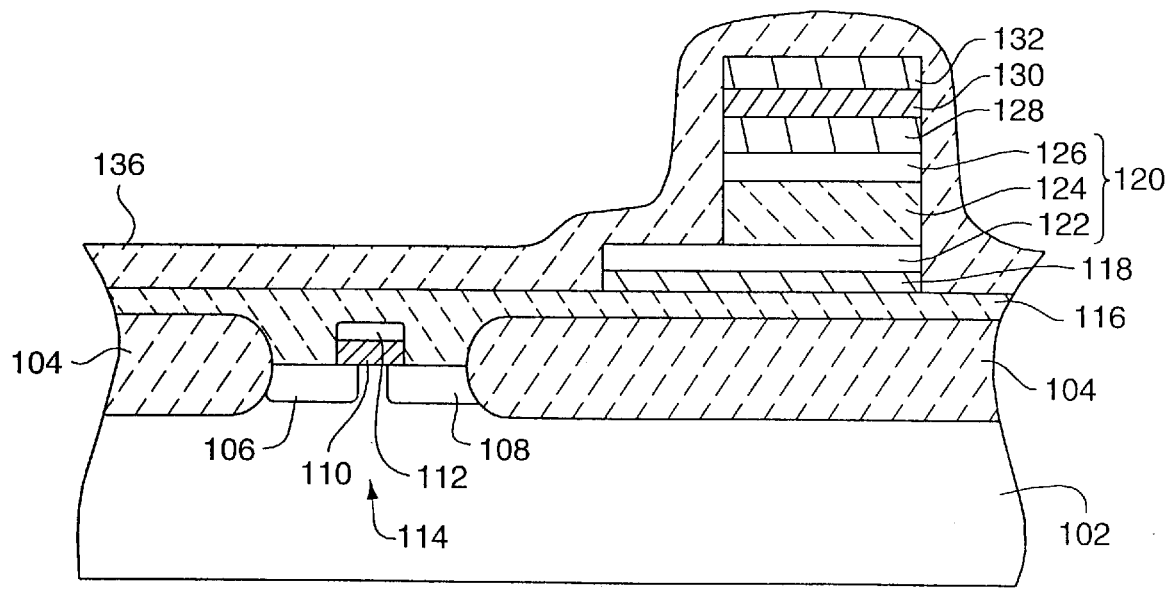
FIG. 4 is a cross-sectional view of a further intermediate stage in the fabrication of an integrated circuit as may be performed by the method of the invention showing an ILD layer formed to cover the MOSFET and the self-aligning thin-film layers of FIG. 3.
Figure 5:
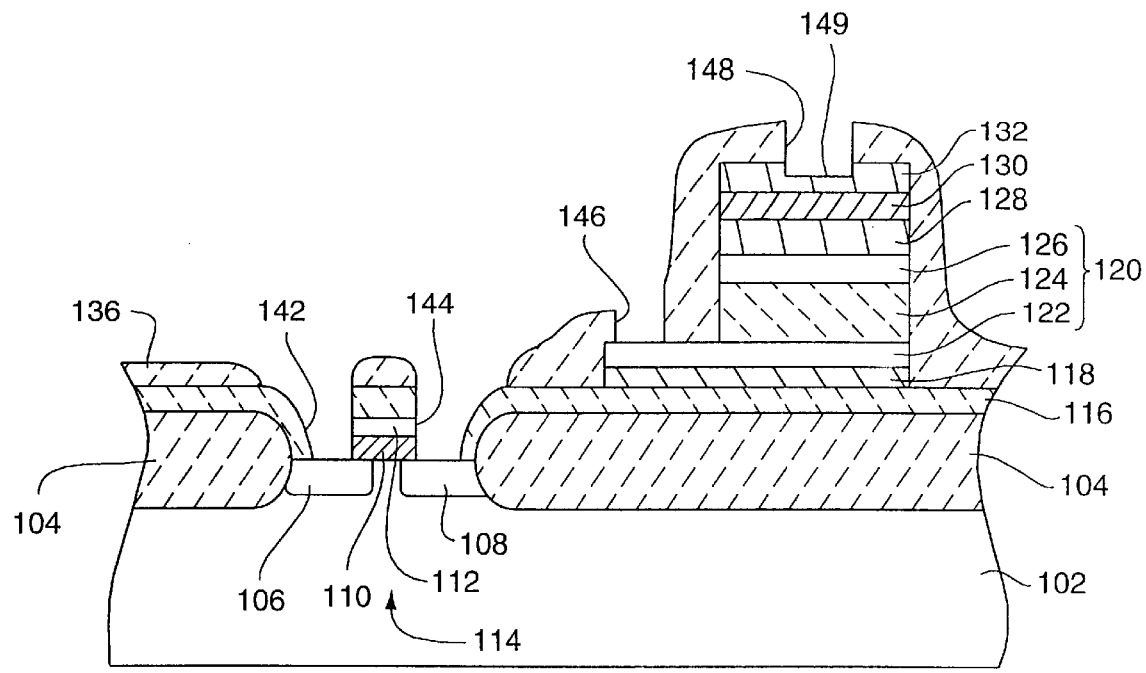
FIG. 5 is a cross-sectional view of a further intermediate stage in the fabrication of an integrated circuit as may be performed by the method of the invention showing wiring holes formed in ILD layers and in a wiring groove in the top surface of the second barrier-adhesion layer.
Figure 6:
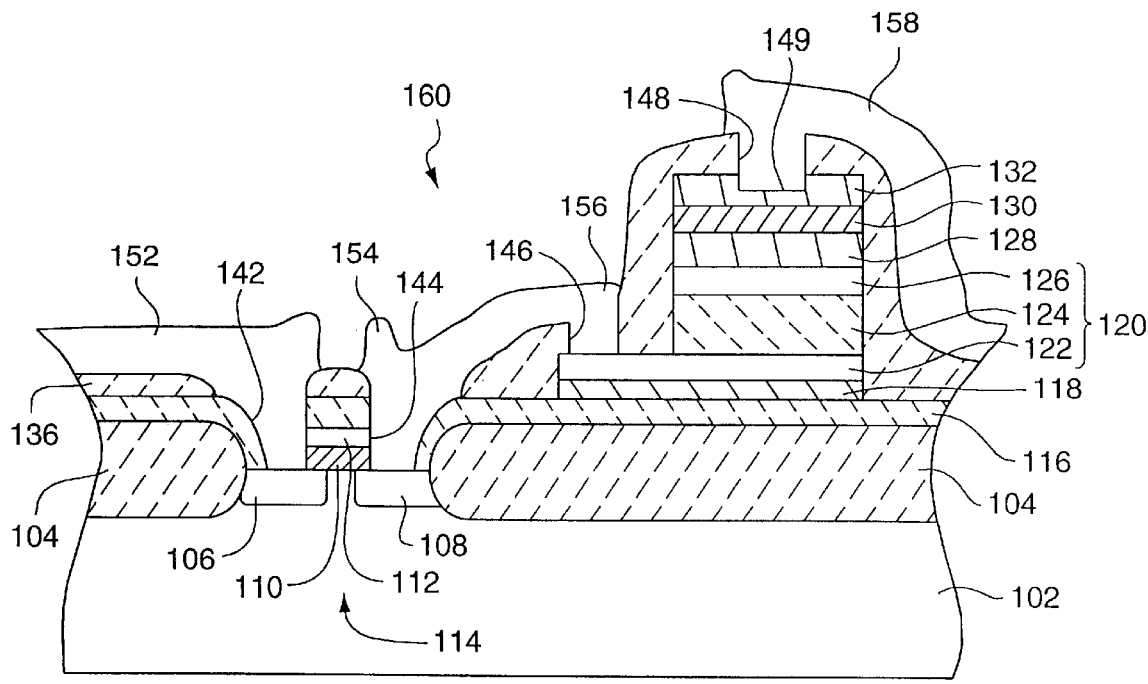
FIG. 6 is a cross-sectional view of a further intermediate stage in the fabrication of an integrated circuit as may be performed by the method of the invention showing wiring layers formed in the wiring holes.

It should be understood that the FIGS. 1–6 depicting fabrication stages of integrated circuit devices are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures instead show idealized representations which are employed to depict more clearly and fully the structure and method of the invention than would otherwise be possible. Also, the figures represent only one of innumerable variations of ferroelectric devices that could be fabricated using the method of the invention. FIG. 6 depicts a ferroelectric memory containing a switch in the form of a field effect transistor in electrical connection with a ferroelectric capacitor. But the hydrogen barrier layer of this invention can also be used in a ferroelectric FET memory in which the ferroelectric element is incorporated in the switch element. Such a ferroelectric FET was described in McMillan, U.S. Pat. No. 5,523,964. Likewise, other integrated circuits fabricated using the method of the invention could include other elements and compositions of material. For example, although this description of the invention focuses on a hydrogen barrier layer used to protect a ferroelectric nonvolatile memory, the invention is useful to protect integrated circuit devices containing nonferroelectric metal oxide materials against hydrogen damage.

Figure 1:
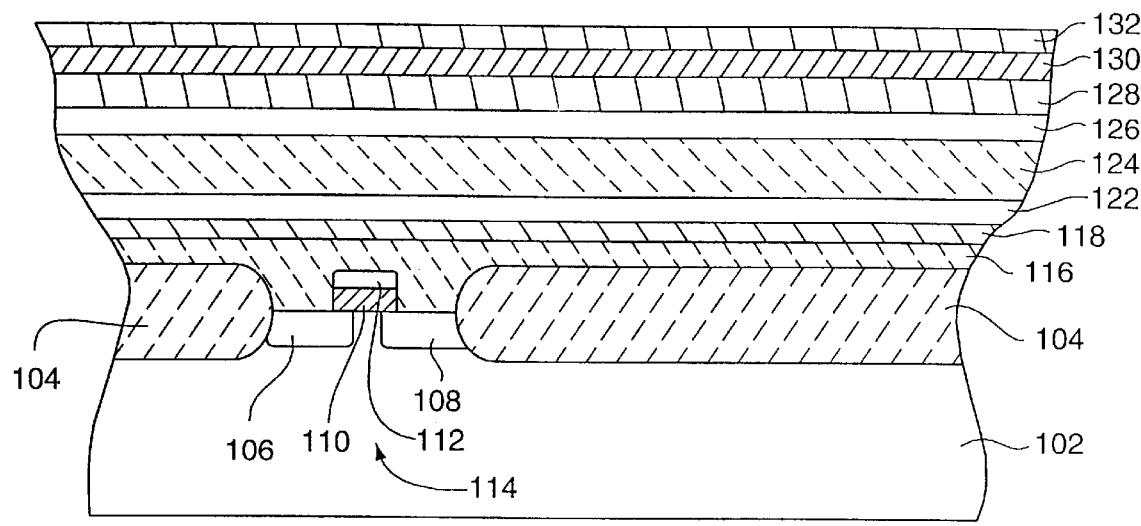
FIG. 1 is a cross-sectional view of an intermediate stage in the fabrication of an integrated circuit as may be performed by the method of the invention showing a MOSFET and a stack of thin film layers before patterning.

Directing attention to FIG. 1, there is shown a cross-sectional view of an intermediate stage in the fabrication of an exemplary nonvolatile ferroelectric memory cell that could be fabricated according to the invention. The general manufacturing steps for fabricating integrated circuits containing MOSFETs and ferroelectric capacitor elements are described in Mihara, U.S. Pat. No. 5,466,629 and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 104 between the source and drain regions 106 and 108. Further, a gate electrode 112 is formed on the gate insulating layer 110. These source region 106, drain region 108, gate insulating layer 110 and gate electrode 112 together form a MOSFET 114.

A first interlayer dielectric layer (ILD) 116 made of BPSG (boron-doped phosphosilicate glass) is formed on substrate 102 and field oxide region 104. An adhesion layer 118 is formed on ILD 116. The adhesion layer 118 is made of, for example, titanium, and typically has a thickness of 200 Å. Adhesion layers, such as a titanium thin film, enhance the adhesion of the electrodes to adjacent underlying or overlying layers of the circuits.

As depicted in FIG. 1, a bottom electrode layer 122 made of platinum and preferably having a thickness of 2000 Å is deposited on adhesion layer 118. Then a ferroelectric thin film 124 of layered superlattice material is formed on bottom electrode layer 122. A top electrode layer 126, made of platinum and preferably having a thickness of 2000 Å, is formed on the ferroelectric thin film 124. The composition of the ferroelectric thin film 124 is discussed in more detail below.

A first barrier-adhesion layer 128, comprising titanium and having a thickness in the range 200–500 Å is deposited on top electrode layer 126. Then hydrogen barrier layer 130, comprising titanium nitride and having a thickness in the range 500–2000 Å, is formed on barrier-adhesion layer 128. A second barrier-adhesion layer 132, having a top surface, is then formed on barrier layer 130. Second barrier-adhesion layer 132 preferably comprises titanium and has a thickness in the range 200–500 Å. This upper, second barrier-adhesion layer 132 may also comprise silicon nitride instead of titanium. The resulting stack of thin film layers depicted in FIG. 1 is then patterned in as few as two patterning processes to form a stacked memory capacitor covered by a self-aligned hydrogen barrier.

Figure 2:
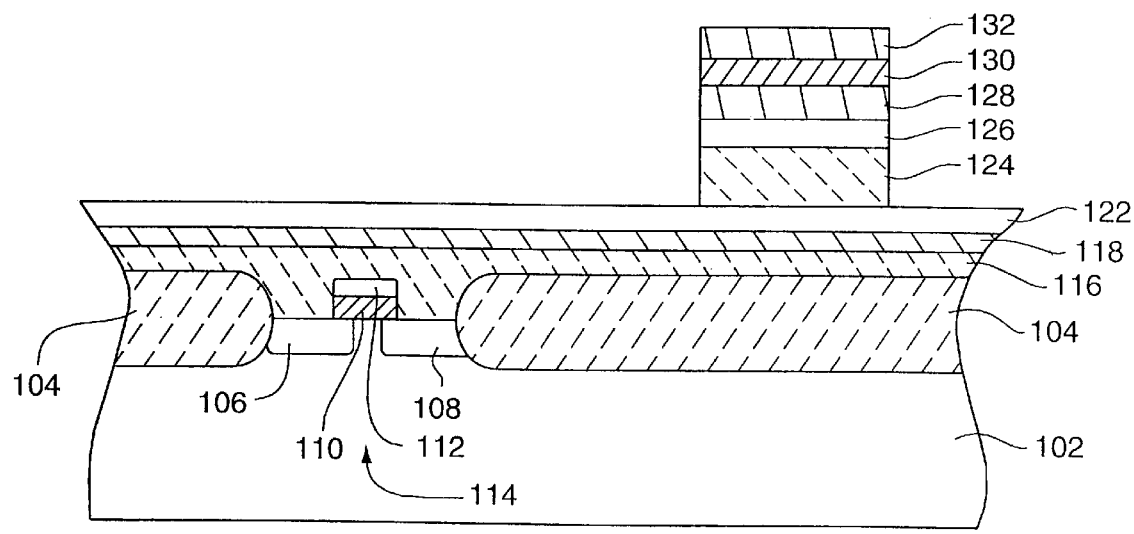
FIG. 2 is a cross-sectional view of a further intermediate stage in the fabrication of an integrated circuit as may be performed by the method of the invention showing self-aligning thin-film layers of FIG. 1 after an initial patterning process.
Figure 3:
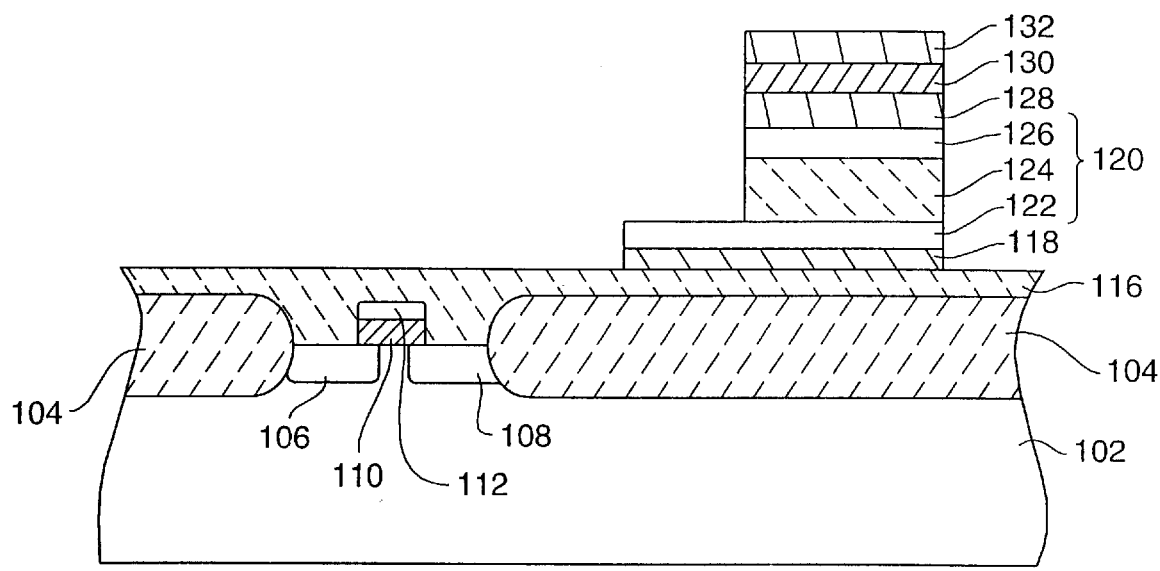
FIG. 3 is a cross-sectional view of a further intermediate stage in the fabrication of an integrated circuit as may be performed by the method of the invention showing self-aligned thin-film layers after a second patterning process forming a ferroelectric capacitor capped by a hydrogen barrier layer and first and second barrier-adhesion layers.

As depicted in FIG. 2, portions of layers 124, 126, 128, 130, and 132 are etched away, down to the surface of layer 122. Then, as depicted in FIG. 3, portions of layers 122 and 118 are etched away, down to the surface of layer 116. As shown in FIG. 3, these patterning processes result in formation of a stacked ferroelectric capacitor 120 covered by self-aligned hydrogen barrier layer 130 and self-aligned barrier-adhesion layers 128 and 132. The titanium in first barrier-adhesion layer 128 enhances the adhesion of hydrogen barrier layer 130 to top electrode 126 because free titanium atoms from layer 128 diffuse into the platinum electrode layer 126.

As depicted in FIG. 4, a second interlayer dielectric layer (ILD) 136 made of NSG (nondoped silicate glass) is formed on ILD 116, covering ferroelectric capacitor 120 and hydrogen barrier layer 130. A PSG (phospho-silicate glass) film or a BPSG (boron phospho-silicate glass) film could also be used in layer 136.

As depicted in FIG. 5, ILD 136 is patterned to form wiring holes for electrical contacts to MOSFET 114 and ferroelectric capacitor 120. Wiring hole 142 is selectively opened through ILD 136 and ILD 116 to expose the source region 106, and wiring hole 144 is selectively opened through ILD 136 and ILD 116 to expose the gate region 108. Wiring hole 146 is selectively opened through the ILD 136 to expose a portion of the bottom electrode 122. Wiring hole 148 is selectively opened through the ILD 136 and a top portion of second barrier-adhesion layer 132 at its top surface to expose second barrier-adhesion layer 132, thereby forming wiring groove 149 in layer 132. The vertical depth of wiring groove 149 preferably is about one-half the thickness of second barrier-adhesion layer 132.

As shown in FIG. 6, source electrode wiring 152 and drain electrode wiring 154 are formed to fill wiring holes 142 and 144, respectively. Bottom electrode wiring 156 is formed to fill wiring hole 146, and top electrode wiring 158 is formed to fill wiring hole 148 and wiring groove 149. The drain electrode wiring 154 is electrically connected to bottom electrode wiring 156, and preferably is the same wiring element. Each of these wirings 152, 154, 156 and 158 preferably is made of Al—Si—Cu standard interconnect metal with a thickness of about 3000 Å. The titanium in second barrier-adhesion layer 132 enhances the adhesion of wiring layer 158 to hydrogen barrier layer 130 because free titanium atoms diffuse into the aluminum wiring. Wiring layer 158 is preferably not formed directly on hydrogen barrier layer 130 because the aluminum would break down the titanium nitride of barrier layer 130 and would thereby reduce the effectiveness of barrier layer 130 to prevent diffusion of hydrogen. Because the second-adhesion barrier layer 132 is subjected to oxidizing conditions during the various fabrication steps of the integrated circuit, it is likely that oxides form in second barrier-adhesion layer 132 at the top surface of layer 132. On the one hand, titanium oxide acts favorably as a getter of hydrogen during the subsequent hydrogen anneal. On the other hand, titanium oxide present at and near the surface of second barrier-adhesion layer 132 due to processing decreases the overall electrical conductivity in layer 132, and thereby hinders electrical contact to ferroelectric capacitor 120. For this reason, wiring groove 149 is formed by removing a portion of the top of second barrier-adhesion layer 132 in the patterning step depicted in FIG. 5. This results in an overall increase of electrical conductivity in layer 132.

Fabrication of the ferroelectric element, for example, the capacitor in FIG. 6, conventionally involves steps with oxidizing conditions that may damage the switch 114 and other elements of the integrated circuit. After the ferroelectric element has been formed, a hydrogen heat treatment of the circuit is usually performed to repair oxidation damage of the switch. During this hydrogen treatment, typically a FGA process, as well as during other high-energy steps causing reducing conditions, the ferroelectric properties of the ferroelectric thin film 124 are prone to degrade because hydrogen may diffuse through the top of the capacitor and react with the oxides of layered superlattice material in ferroelectric thin film 124. But hydrogen barrier layer 130 located directly over the ferroelectric thin film 124 effectively prevents hydrogen from diffusing vertically into the ferroelectric thin film through the top electrode 126. Also, some small amounts of hydrogen typically diffuse laterally into ferroelectric thin film 124 from the side edges of capacitor 120, adversely affecting capacitor leakage performance. For this reason, excess metal oxides may be intentionally formed in the ferroelectric thin film 124 by including metal moieties in thin film 124 in excess of the stoichiometrically balanced amount necessary to form the layered superlattice material of ferroelectric thin film 124. The excess oxides combine with hydrogen at the lateral edges of the ferroelectric thin film and inhibit its diffusion into the interior of ferroelectric thin film 124. Thus, the excess oxides act as a hydrogen "getter" and protect the interior portions of ferroelectric thin film 124.

Similarly, small amounts of oxygen may be added to the sputter-gas atmosphere during formation of the upper, second barrier-adhesion layer 132 to form titanium oxide. The titanium oxide in the titanium layer 132 also acts as a getter of hydrogen and thereby provides additional protection against hydrogen degradation of the ferroelectric thin film 124.

The word "substrate" can mean the underlying wafer 102 on which the integrated circuit is formed, as well as any object on which a thin film layer is deposited, such as BPSG layer 116. In this disclosure, "substrate" shall mean the object to which the layer of interest is applied; for example, when we are talking about a bottom electrode, such as layer 122, the substrate includes bottom electrode layer 122, as well as layers 118 and 116 on which the electrode 122 is formed.

The terms "above", "upper", and "top" herein mean relative to the silicon substrate 102. That is, if a second element is "above" a first element, it means it is farther from the substrate 102. Corresponding terms in the opposite sense, such as "below", "lower", "bottom" and "underlying" mean it is closer to the substrate 102 than the other element. The long dimension of substrate 102 defines a plane that is considered to be a "horizontal" plane herein, and directions perpendicular to this plane are considered to be "vertical".

A ferroelectric element typically comprises a relatively flat thin film of ferroelectric material. The terms "lateral" or "laterally" refer to the direction of the flat plane of the thin film. In FIGS. 1–6, the lateral direction would be the horizontal direction.

This specification refers variously to one layer being "directly over" another layer; for example, a hydrogen barrier layer being formed directly over a thin film of metal oxide material. By "directly over" is meant that the one layer is above at least a portion of another, but it need not be above all of the layer. The hydrogen barrier layer is directly over at least a portion of the metal oxide thin film in the vertical direction in FIGS. 1–6. For example, in FIG. 6, the hydrogen barrier layer 130 is directly over ferroelectric thin film 124, and it is also directly over bottom electrode 122, even though it is not directly over the portion of bottom electrode 122 in contact with wiring layer 156. The term "directly over" does not mean that the layers are in direct contact with each other. As long as a hydrogen barrier layer is directly over a portion of a metal oxide layer, it will protect that portion from hydrogen diffusion. It is clear that metal oxide elements can be fabricated with varying orientations relative to the horizontal and vertical. For example, if the ferroelectric thin film is in the vertical plane, then the word "lateral" would refer to the vertical direction, and "directly over" would refer to an orientation normal to the vertical plane of the thin film. The terms "on" and "onto" are often used in the specification when referring to the location or formation of an integrated circuit layer with respect to another, underlying layer or substrate. In contrast to "directly over", the terms "on" and "onto" generally signify direct contact, as will be clear from the various contexts in which they are used.

The term "thin film" is used herein as it is used in the integrated circuit art. Generally, it means a film of less than a micron in thickness. The thin films disclosed herein are in all instances less than 0.5 microns in thickness. Preferably, the ferroelectric thin films 124 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "self-aligned" is used to refer to one or more layers formed and patterned in such a manner that they automatically align with one or more other layers. For example, if the top electrode 126, barrier-adhesion layers 128 and 132, and hydrogen barrier layer 130 are patterned together in the same photomask and etch patterning process, they will be self-aligned.

The composition of the ferroelectric thin film 124 can be selected from a group of suitable ferroelectric oxide materials, including but not limited to: an $ABO_3$ type perovskite, such as a titanate (e.g., $BaTiO_3$, $SrTiO_3$, $PbTiO_3$ (PT), $PbZrTiO_3$ (PZT)), a niobate (e.g., $KNbO_3$), and layered superlattice materials. Preferably, thin film layer 124 comprises a ferroelectric layered superlattice material, including but not limited to strontium bismuth tantalate ($SrBi_2Ta_2O_9$) and strontium bismuth tantalum niobate ($SrBi_2Ta_{2-x}Ni_xO_9$). Most preferably, thin film 124 comprises layered superlattice material with a composition represented by the formula $SrBi_{2.18}Ta_{1.44}Nb_{0.56}O_9$. Alternatively, the thin film 124 may comprise nonferroelectric metal oxides, such as high-dielectric constant materials used in DRAM cells, selected from a group including but not limited to: barium strontium titanate ("BST"), barium strontium niobate ("BSN"), certain $ABO_3$-type perovskites, and certain layered superlattice materials.

The word "compound" used precisely refers to a homogeneous substance in which the identical molecules all comprise the same chemical elements and structure. The term "material" may comprise molecules of different composition. For example, the layered superlattice material strontium bismuth tantalum niobate comprises interconnected crystal lattices in which two different kinds of atoms, tantalum and niobium, occupy variously the B-site positions of the crystal structure. Nevertheless, the terms "layered superlattice material", "layered superlattice compound", and "layered superlattice material compound" are used virtually interchangeably in this specification and their meaning is clear from the context.

U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. Nos. 5,434,102 issued Jul. 18, 1995 and 5,468,684 issued Nov. 21, 1995, incorporated herein by reference, describe processes for integrating these materials into practical integrated circuits.

The layered superlattice materials may be summarized generally under the formula:

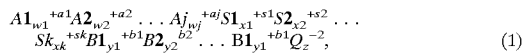  (1)

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, and thallium; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by strontium atoms and 25% of the A-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2W2 \ldots +ajwj)+(s1x1+s2x2 \ldots +skxk)+ (b1y1+b2y2 \ldots +blyl)=2z. \qquad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material. In this disclosure, an "excess" amount of a metallic element means an amount greater than required to bond with the other metals present to make the desired material, with all atomic sites occupied and no amount of any metal left over.

Based on U.S. Pat. No. 5,434,102, issued Jul. 18, 1995 to Watanabe, et al., and on related work, the precursor for making layered superlattice materials preferred by those skilled in the art presently has the stoichiometric formula $SrBi_{2.18}Ta_{1.44}Nb_{0.56}O_9$. It is believed that a precursor with this formula will result in a final solid strontium bismuth tantalum niobate thin film with the balanced stoichiometric formula $SrBi_2Ta_{1.44}Nb_{0.56}O_9$. That is, the final thin film does not contain excess bismuth because the excess bismuth in the precursor is carried away as bismuth oxide gas during the fabrication process. This precursor solution contains amounts of chemical precursors corresponding to the stoichiometric ratio $SrBi_{2.18}Ta_{1.44}Nb_{0.56}O_9$. This stoichiometric formula is referred to herein as the "standard" formula having the "standard" ratio of niobium to tantalum. A precursor having the standard stoichiometric formula includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. One feature of the invention is that a final layered superlattice compound with excess metal, that is, amounts of at least one metal, such as bismuth and niobium, above or in addition to that shown in the standard formula, is more resistant to degradation by hydrogen than material made with a precursor having the standard formula. A related feature is that excess amounts of a B-site element, such as niobium, in a layered superlattice material are effective in preventing the degradation of the electronic properties by exposure to hydrogen.

2. Detailed Description

Figure 7:
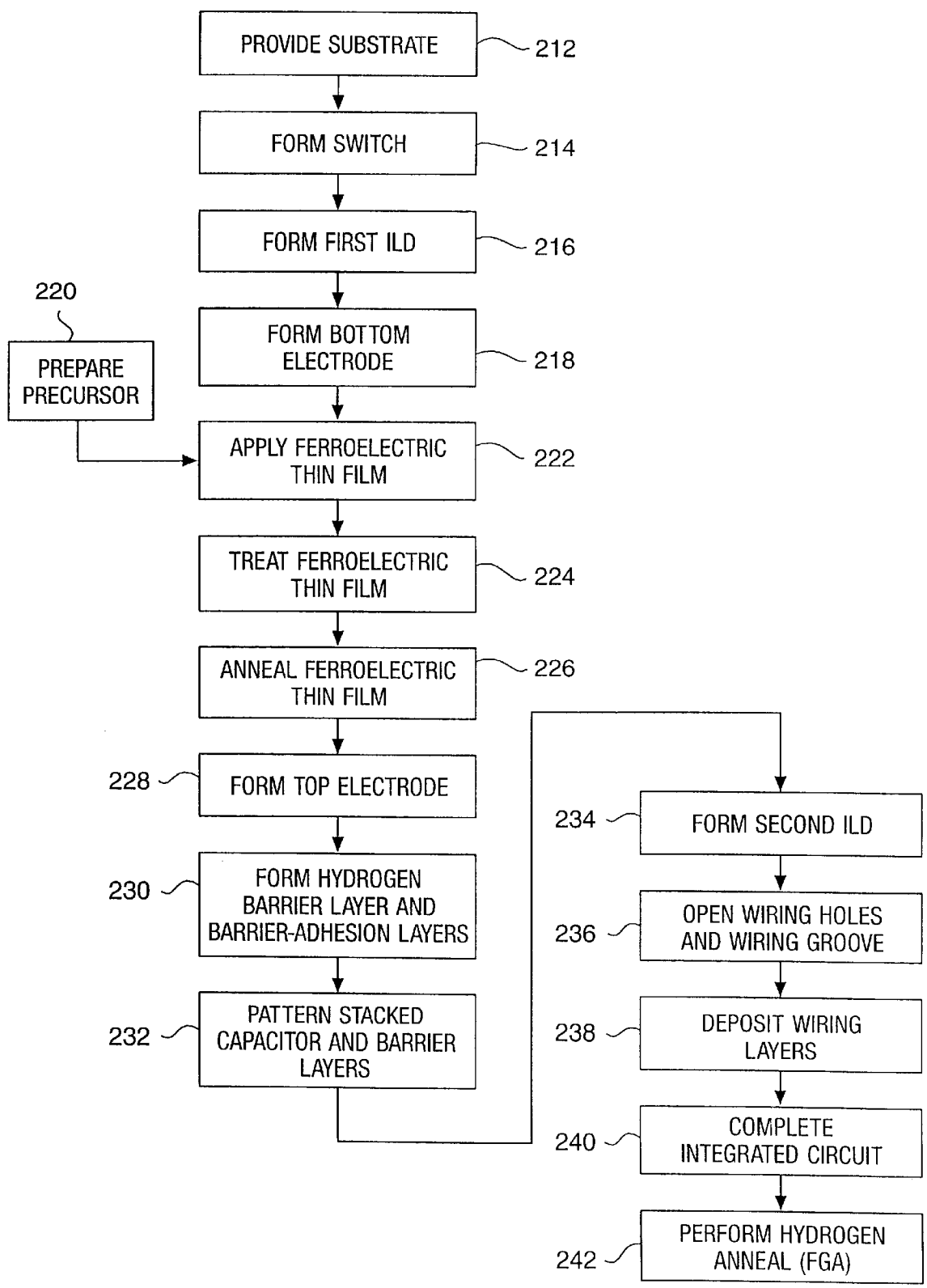
FIG. 7 is a flow chart showing a preferred embodiment of a method for fabricating a nonvolatile ferroelectric memory device according to the invention.

The diagram of FIG. 7 is a flow sheet of the fabrication steps used in this invention to make a ferroelectric memory 160. The ferroelectric memory 160 is preferably formed on a conventional wafer that may be silicon, gallium arsenide or other semiconductor, or an insulator, such as glass or magnesium oxide (MgO). In step 212, a semiconductor substrate 102 (FIG. 1) is provided on which a switch 114 is formed in step 214. The switch is typically a MOSFET. In step 216, a first interlayer dielectric layer 116 is formed to separate the switching element from the ferroelectric element to be formed. In step 218, a bottom electrode layer 122 is formed. Preferably, the electrode layer 122 is made of platinum and is sputter-deposited to form a layer with a thickness of about 2000 Å. In the preferred method, an adhesion layer 118 made of titanium or titanium nitride preferably having a thickness of about 200 Å would be formed in this step, preferably by sputtering, prior to depositing the electrode. In step 220, chemical precursors of the layered superlattice compounds that will form the desired ferroelectric thin film are prepared. The ferroelectric thin film 124 is applied to the bottom electrode layer in step 222. An MOCVD method is the most preferred method to form the thin film. The ferroelectric thin films also can be applied using a liquid deposition technique, such as a spin-coating or a misted deposition method as described in U.S. Pat. No. 5,456,945. Usually, a final precursor solution is prepared from commercially available solutions containing the chemical precursor compounds. Preferably, the concentrations of the various precursors supplied in the commercial solutions are adjusted in step 220 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. It is often desirable, however, to add extra niobium or bismuth to this solution to generate extra oxides that will protect the ferroelectric compounds from hydrogen degradation during reducing conditions. The application step 222 is preferably followed by a treatment step 224 which may include a drying step, for liquid-deposition techniques, and a crystallization substep at elevated temperatures, such as an oxygen furnace anneal or a rapid thermal process (RTP) anneal; treatment step 224 may include treatment with ultraviolet radiation during or after the application step 222. Steps 222 and 224 may be repeated as necessary to form a film of the desired thickness. For example, in a typical spin-on procedure, a coat of the precursor might be applied and dried. Then another precursor coat might be applied and dried. The treated film is then annealed in oxygen to form the resulting ferroelectric thin film 124 in step 226. Following steps 222–226, the top electrode layer 126 is formed in step 228. Preferably, top electrode layer 126 is made of platinum and is sputter-deposited to form a layer preferably with a thickness of about 2000 Å. First barrier-adhesion layer 128, hydrogen barrier layer 130, and second barrier-adhesion layer 132, in that order, are formed in steps 230 above top electrode layer 126. In steps 230, lower, first barrier-adhesion layer 130, comprising titanium and having a preferred thickness of 300 Å, is deposited onto top electrode layer 126, preferably by a sputtering process. Next, hydrogen barrier layer 130, comprising titanium nitride and having a preferred thickness of 1200 Å is deposited, preferably by a sputtering process. Finally, second barrier-adhesion layer 130, comprising titanium and having a preferred thickness of 300 Å, is deposited onto hydrogen barrier layer 130, preferably by a sputtering process. It may be desirable to deposit titanium oxide near the top surface of second barrier-adhesion layer 132 by including a small amount of $O_2$-gas in the sputter atmosphere during the latter part of the sputter-deposition of layer 132. The resulting oxides that form in the second barrier-adhesion layer 132 protect the ferroelectric compounds in the memory device by reacting with the hydrogen that can be present in various manufacturing process steps. Between zero and about ten volume-percent, $O_2$-gas is added to the sputter atmosphere during deposition of the top half of the second barrier-adhesion layer, and this amount is sufficient to oxidize between zero and 50% of the titanium atoms deposited in the top half of the second barrier-adhesion layer. Preferably, about 50% of the titanium in the top half is present in the form of titanium oxide. Barrier layer formation steps 230 are preferably followed by patterning steps 232 in which the stacked layers 118, 122, 124, 126, 128, 130, and 132 are patterned to form ferroelectric capacitor 120, covered by self-aligning hydrogen barrier layer 130 and barrier-adhesion layers 128 and 132. Preferably, only two etching processes are required to complete the patterning of steps 232. Preferably, a conventional ion milling process is utilized in steps 232. A second ILD layer 136 is then deposited in step 234 to cover ILD 116 and capacitor 120, including hydrogen barrier layer 130 and barrier-adhesion layers 128 and 132. In step 236, wiring holes 142, 144, 146, and 148 are made through the ILD layers 116 and 136, as depicted in FIG. 5, to the switch 114 (typically to the source and drain regions of a MOSFET), to the bottom electrode 122, and to second barrier-adhesion layer 132, respectively. Also in step 236, wiring groove 149 is etched out of second barrier-adhesion layer 132. The vertical depth of wiring groove 149 preferably is about one-half the thickness of second barrier-adhesion layer 132. Preferably, step 236 is performed using a standard ion milling process. In step 238, wirings 152, 154, 156, and 158 are deposited, preferably using a sputtering process. However, CVD processes can also be used, despite their accompanying reducing conditions, because hydrogen barrier layer 130 protects the ferroelectric oxides of thin film 124. The circuit is completed in the steps 240, which typically include deposition of a passivation layer. Finally, hydrogen annealing is performed in step 242 to repair defects and restore desired semiconductor properties in the switch (MOSFET) 114. Preferably, the hydrogen anneal of the integrated circuit is a FGA process, preferably conducted at atmospheric pressure in a $H_2$—$N_2$ (forming gas) gas mixture with one to ten percent (1–10%) $H_2$, at a temperature of between 200° and 400° C. for a time duration of from ten to 40 minutes.

Experiments have shown that lateral diffusion of the hydrogen through the ferroelectric thin film, that is, diffusion in a direction parallel to the plane of the ferroelectric thin film, is slow compared with diffusion in a direction normal to the plane of the ferroelectric film. It is, therefore, believed that extra oxides in the ferroelectric material at the lateral edges of the ferroelectric layer 124 act effectively as a getter for any hydrogen that may penetrate in the lateral direction and protects the rest of the material from hydrogen. Generally, the combination of the titanium-nitride hydrogen barrier layer 130 together with titanium oxide at the top surface of titanium barrier-adhesion layer 132 and excess oxides in ferroelectric thin film 124 is sufficient to protect the ferroelectric thin film 124 from significant hydrogen degradation by conventional IC manufacturing processes.

As discussed above, a feature of the invention is to provide a hydrogen barrier layer that covers the ferroelectric layered superlattice material thin film. Also, good ferroelectric properties can be preserved by using precursors with excess metal, such as excess bismuth and/or excess niobium. Further, presence of additional oxygen in integrated circuit layers laid down subsequent to the ferroelectric layers, such as in the upper, barrier-adhesion layer, which oxygen acts as a getter for hydrogen during subsequent hydrogen treatments, can also be effectively used in combination with the hydrogen barrier layer of the invention. In this manner, the invention provides methods and structures that effectively inhibit degradation of ferroelectric elements exposed to hydrogen during manufacturing steps necessary to create and perfect other portions of the integrated circuit.

There has been described new structures and compositions of hydrogen barrier layers for protecting both ferroelectric and nonferroelectric, high-dielectric constant metal oxide materials in integrated circuits against hydrogen degradation. In particular, there has been described a method and structure for fabricating a ferroelectric integrated circuit that permit exposure to hydrogen and still result in devices with good electronic properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. An integrated circuit comprising:
   an integrated circuit portion including a thin film of metal oxide material;
   a first barrier-adhesion layer directly over said thin film of metal oxide material;
   a hydrogen barrier layer on said first barrier-adhesion layer and directly over said thin film of metal oxide material; and
   a second barrier-adhesion layer, having a top surface, on said hydrogen barrier layer; wherein said first barrier-adhesion layer, said hydrogen barrier layer, and said second barrier-adhesion layer are self-aligned.

2. An integrated circuit as in claim 1, wherein said first barrier-adhesion layer comprises titanium, said hydrogen barrier layer comprises titanium nitride, and said second barrier-adhesion layer comprises titanium.

3. An integrated circuit as in claim 1, wherein said metal oxide material comprises an $ABO_3$-type perovskite.

4. An integrated circuit as in claim 1, wherein said metal oxide material comprises a ferroelectric layered superlattice material.

5. An integrated circuit as in claim 4, wherein said ferroelectric layered superlattice material comprises strontium bismuth tantalate.

6. An integrated circuit according to claim 4, wherein said layered superlattice material comprises strontium bismuth tantalum niobate.

7. An integrated circuit as in claim 1, wherein said integrated circuit portion comprises:
   a substrate;
   a bottom electrode layer on said substrate, said thin film of metal oxide material located on said bottom electrode layer; and
   a top electrode layer on said thin film of metal oxide material;
   wherein said first barrier-adhesion layer directly over said thin film of metal oxide material is located on said top electrode layer.

8. An integrated circuit as in claim 7, wherein said bottom electrode layer and said top electrode layer comprise platinum.

9. An integrated circuit comprising:
   an integrated circuit portion including a thin film of metal oxide material;
   a first barrier-adhesion layer directly aver said thin film of metal oxide material;
   a hydrogen barrier layer on said first barrier-adhesion layer and directly over said thin film of metal oxide material; and
   a second barrier-adhesion layer, having a top surface, on said hydrogen barrier layer;
   wherein a portion of said second barrier-adhesion layer has a wiring groove at said top surface.

10. An integrated circuit comprising:
    an integrated circuit portion including a thin film of metal oxide material;
    a first barrier-adhesion layer directly over said thin film of metal oxide material;
    a hydrogen barrier layer on said first barrier-adhesion layer and directly over said thin film of metal oxide material; and
    a second barrier-adhesion layer, having a top surface, on said hydrogen barrier layer;
    wherein said second barrier-adhesion layer comprises titanium oxide.

* * * * *